US010256117B2

(12) United States Patent
Mitarai et al.

(10) Patent No.: US 10,256,117 B2
(45) Date of Patent: Apr. 9, 2019

(54) MANUFACTURING METHOD AND WIRING SUBSTRATE WITH THROUGH ELECTRODE

(71) Applicant: SONY CORPORATION, Tokyo (JP)

(72) Inventors: Shun Mitarai, Kanagawa (JP); Shusaku Yanagawa, Kanagawa (JP); Hiroshi Ozaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/568,541

(22) PCT Filed: Apr. 25, 2016

(86) PCT No.: PCT/JP2016/002175
§ 371 (c)(1),
(2) Date: Oct. 23, 2017

(87) PCT Pub. No.: WO2016/178311
PCT Pub. Date: Nov. 10, 2016

(65) Prior Publication Data
US 2018/0158695 A1 Jun. 7, 2018

(30) Foreign Application Priority Data
May 1, 2015 (JP) ................................ 2015-093877

(51) Int. Cl.
*H01L 21/02* (2006.01)
*H01L 21/48* (2006.01)
(Continued)

(52) U.S. Cl.
CPC ........ *H01L 21/486* (2013.01); *H01L 21/6835* (2013.01); *H01L 23/49827* (2013.01);
(Continued)

(58) Field of Classification Search
CPC ... H05K 1/09; H05K 1/11; H05K 1/16; H05K 3/00; H05K 3/42; H05K 3/46;
(Continued)

(56) References Cited

U.S. PATENT DOCUMENTS 5,950,306 A * 9/1999 Suzuki .................. H05K 3/423
29/830
5,995,188 A * 11/1999 Shimizu ................ G02F 1/1347
349/147
(Continued)

FOREIGN PATENT DOCUMENTS

| JP | 2006 173251 A | 6/2006 |
|----|---------------|--------|
| JP | 2007 103698 A | 4/2007 |
| JP | 2013 077809   | 4/2013 |

OTHER PUBLICATIONS

International Search Report and Written Opinion prepared by the Japan Patent Office dated Jul. 19, 2016, for International Application No. PCT/JP2016/002175.

*Primary Examiner* — Xiaoliang Chen
(74) *Attorney, Agent, or Firm* — Sheridan Ross P.C.

(57) ABSTRACT

There is provided a method for manufacturing a wiring substrate with a through electrode, the method including providing a device substrate having a through hole, an opening of the through hole being blocked by a current supply path and the wiring substrate including the device substrate as a core layer with the through electrode; and disposing a first metal in the through hole to form the through electrode by electroplating, in a depth direction of the through hole, using the current supply path.

13 Claims, 10 Drawing Sheets

(51) Int. Cl.
*H01L 23/498* (2006.01)
*H05K 3/42* (2006.01)
*H01L 21/683* (2006.01)
*H05K 1/03* (2006.01)
*H05K 3/46* (2006.01)
*H01L 21/288* (2006.01)
*H01L 23/00* (2006.01)

(52) U.S. Cl.
CPC .. H01L 23/49838 (2013.01); H01L 23/49866 (2013.01); H05K 3/423 (2013.01); *H01L 21/2885* (2013.01); *H01L 21/4857* (2013.01); *H01L 23/49816* (2013.01); *H01L 24/16* (2013.01); *H01L 2221/68318* (2013.01); *H01L 2221/68345* (2013.01); *H01L 2221/68359* (2013.01); *H01L 2221/68386* (2013.01); *H01L 2224/16225* (2013.01); *H01L 2224/32225* (2013.01); *H01L 2224/73204* (2013.01); *H01L 2924/15311* (2013.01); *H05K 1/0306* (2013.01); *H05K 3/4605* (2013.01); *H05K 2201/09563* (2013.01); *H05K 2203/0733* (2013.01)

(58) Field of Classification Search
CPC ......... H01L 21/02; H01L 21/44; H01L 21/56; H01L 21/60; H01L 21/285; H01L 21/768; H01L 23/00; H01L 23/49
USPC ....... 174/262, 255, 257, 260, 261, 264, 266; 438/107, 612, 641, 666, 674; 257/416, 257/678, 737, 741, 777; 29/830, 848, 29/852
See application file for complete search history.

(56) References Cited

U.S. PATENT DOCUMENTS

| | | | | |
|---|---|---|---|---|
| 6,323,439 B1 * | 11/2001 | Kambe | ................ | H05K 3/0038 174/255 |
| 6,404,061 B1 * | 6/2002 | Hikita | ................ | H01L 25/0657 257/688 |
| 6,555,763 B1 * | 4/2003 | Hirasawa | ............ | H01L 21/4857 174/262 |
| 6,597,027 B1 * | 7/2003 | Hashimoto | ............. | H01L 28/75 257/295 |
| 7,902,674 B2 * | 3/2011 | Chang | ................ | H01L 21/6835 257/777 |
| 8,178,957 B2 * | 5/2012 | Taguchi | ................. | B81B 7/007 257/678 |
| 8,933,342 B2 * | 1/2015 | Suzuki | ................. | H05K 1/0246 174/260 |
| 9,090,458 B2 * | 7/2015 | Hong | .................... | B06B 1/0292 |
| 9,293,338 B2 * | 3/2016 | Lin | .................... | H01L 21/28587 |
| 2002/0108781 A1 * | 8/2002 | Mune | .................... | H01L 21/486 174/264 |
| 2003/0134510 A1 * | 7/2003 | Lee | ......................... | C25D 5/022 438/674 |
| 2003/0209747 A1 * | 11/2003 | Hashimoto | ............. | H01L 28/75 257/295 |
| 2005/0037601 A1 * | 2/2005 | Hsu | ...................... | H01L 21/4846 438/612 |
| 2006/0073701 A1 * | 4/2006 | Koizumi | ............. | H01L 21/6835 438/666 |
| 2006/0234499 A1 * | 10/2006 | Kodera | .................. | B82Y 30/00 438/641 |
| 2006/0243482 A1 * | 11/2006 | Chou | ..................... | H05K 3/427 174/262 |
| 2007/0029654 A1 * | 2/2007 | Sunohara | ............ | B81C 1/00301 257/678 |
| 2008/0067073 A1 * | 3/2008 | Kagawa | ............... | H01L 21/486 205/125 |
| 2008/0251386 A1 * | 10/2008 | Lin | ........................ | H05K 3/423 205/125 |
| 2008/0261396 A1 | 10/2008 | Yamano | | |
| 2009/0014891 A1 * | 1/2009 | Chang | ................. | H01L 21/6835 257/777 |
| 2009/0245720 A1 * | 10/2009 | Choki | .................. | G02B 6/4231 385/14 |
| 2009/0288870 A1 * | 11/2009 | Kondo | ................. | H01L 21/4846 174/261 |
| 2010/0226606 A1 * | 9/2010 | Choki | .................. | G02B 6/4231 385/14 |
| 2012/0103667 A1 * | 5/2012 | Ito | ......................... | H01L 21/486 174/257 |
| 2012/0298413 A1 * | 11/2012 | Mori | ...................... | H05K 3/425 174/266 |
| 2013/0075141 A1 * | 3/2013 | Suzuki | ................. | H05K 1/0246 174/257 |
| 2013/0083503 A1 * | 4/2013 | Lai | .................... | H01L 23/49894 361/783 |
| 2013/0309863 A1 * | 11/2013 | Lin | .................... | H01L 21/76843 438/653 |
| 2014/0134797 A1 * | 5/2014 | Chi | .......................... | H01L 24/96 438/107 |
| 2014/0145275 A1 * | 5/2014 | Hong | .................... | B06B 1/0292 257/416 |
| 2014/0264860 A1 * | 9/2014 | Hsien | ................ | H01L 23/49827 257/741 |
| 2014/0326608 A1 * | 11/2014 | He | ....................... | C25D 17/008 205/143 |
| 2014/0367849 A1 * | 12/2014 | Chiang | ................... | H01L 24/14 257/737 |

\* cited by examiner

Fig. 7

A STOPPER DEPOSITION (Mo, Cu, a-Si, etc.)
WIRING FORMATION
CARRIER STICKING (TB MATERIAL HAVING PLATING RESISTANCE)

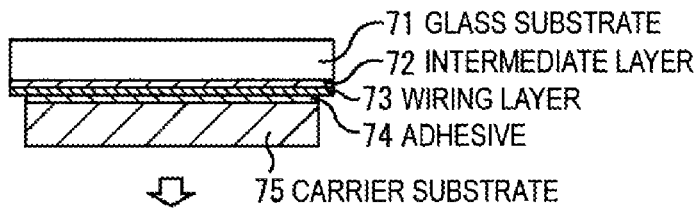

71 GLASS SUBSTRATE
72 INTERMEDIATE LAYER
73 WIRING LAYER
74 ADHESIVE
75 CARRIER SUBSTRATE

B THINNING/
VIA OPENING    THROUGH HOLE

C STOPPER OPENING
※NOT NECESSARY IN CASE OF METAL
(DRY/WET USING TGV AS MASK)

STOPPER OPENING
(OPENING USING MASK
SMALLER THAN TGV)

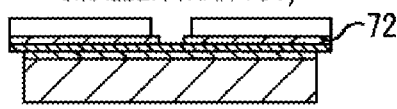

D ELECTROPLATING (Cu)
76 Cu

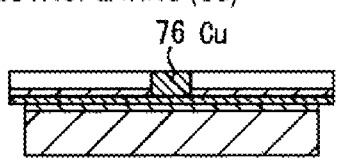

E STICKING
  PEELING    76

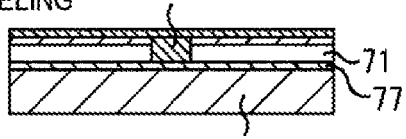

71
77
78

F WIRING
  PROCESSING   76    73

72
71

MANUFACTURING METHOD AND WIRING SUBSTRATE WITH THROUGH ELECTRODE

CROSS REFERENCE TO RELATED APPLICATIONS

This application is a national stage application under 35 U.S.C. 371 and claims the benefit of PCT Application No. PCT/JP2016/002175 having an international filing date of 25 Apr. 2016, which designated the United States, which PCT application claimed the benefit of Japanese Priority Patent Application JP 2015-093877 filed May 1, 2015, the disclosures of which are incorporated herein by reference.

TECHNICAL FIELD

The present disclosure relates to a manufacturing method and a wiring substrate with a through electrode, and more particularly to a manufacturing method and a wiring substrate with a through electrode that are suitably applicable, for example, when a though electrode is formed in a substrate using glass as a core material.

BACKGROUND ART

A number of LSI chips are used in electronic appliances currently distributed regardless of the types thereof.

Commonly, a LSI chip is once mounted on a wiring substrate for a package (hereinafter referred to also as an interposer), and the wiring substrate having the LSI chip mounted thereon, together with other parts, is mounted on a mother board (referred to also as a main board). This is because it may be technically and costly difficult to match the pitch of fine terminals (micro bumps 12) of the LSI chip with the pitch of terminals (solder balls 13) of the mother board that may be difficult to be made fine. With the progress of the technology node of the LSI chip, the pitch of the terminals has continued to be reduced, and the interposer that governs wiring relay with the mother board is also expected to be reduced in terminal pitch.

FIG. 1 illustrates one example of the configuration of the mother board mounting the wiring substrate including the LSI chip thereon. FIG. 2 illustrates one example of the detailed configuration of the wiring substrate.

Typically, a wiring substrate 11 has a structure in which one or more layers of a wiring layer 23 are formed on both surfaces of a core layer 21 composed of a predetermined core material, and the wiring layers formed on both surfaces are connected to each other via through holes 22 formed in the core layer 21.

As the core material constituting the core layer 21, an organic material such as glass epoxy, silicon, glass or the like is used, and the wiring substrates 11 using the organic material, the silicon and the glass are referred to as an organic substrate, a silicon substrate and a glass substrate, respectively.

Although the organic substrate has been used as the wiring substrate for years, the organic substrate has increasingly made it difficult to follow the miniaturization of the LSI. Accordingly, in recent years, attention is focused on the silicon substrate or the glass substrate allowing the wiring to be miniaturized.

These wiring substrates not only allow the wiring to be miniaturized, but also have high matching in thermal expansion coefficient with the silicon as a material of the LSI chip, making it possible to improve connection reliability. In particular, the glass substrate may have various advantages in satisfactory high frequency property caused by insulation of the glass, and the like over the organic substrate.

Meanwhile, the technical features applied to the silicon substrate or the glass substrate may include a through silicon via (TSV) and a through glass via (TGV). The TSV or TGV refers to a structure in which a through hole is formed in the core layer, and the formed through hole is filled with metal or the like to form a through electrode. Specifically, for example, a seed layer to be a current supply path is formed on a side face of the formed through hole, and plating is laterally grown within the through hole from the seed layer to fill the through hole with the plating to form the through electrode.

However, when the TSV or TGV is formed in the silicon substrate or the glass substrate, since an aspect ratio indicating a ratio of the depth to the diameter of the through hole is high and the absolute depth of the through hole is high, the plating filling after the opening of the through hole as described above may easily cause embedded failures (voids).

Accordingly, as one method to solve this problem, technology has been proposed in which a plating film is formed on one surface of the substrate to block one opening of the through hole, and plating is grown from the opposite surface in a semi-additive form by using the plating film as a current supply path to fill the through hole with the plating (see, for example, PTL 1).

CITATION LIST

Patent Literature

PTL 1: JP 2013-077809A

SUMMARY OF INVENTION

Technical Problem

The technology proposed in PTL 1 will be specifically described with reference to FIG. 3.

First, when a plating film to be a current supply path is formed, as shown in FIG. 3A, a seed layer 32 is formed on a one surface side of a substrate 31 having a through hole formed therein by using sputtering or the like. When the seed layer 32 is formed, however, the seed layer is deposited not only on the surface on the one surface side of the substrate 31 but slightly on the inner wall of the through hole. Especially for the glass substrate, since a processing method in which a taper angle of the through hole formed in the glass is less than 90 degrees is often used, this tendency may be re-markable.

Note that, as described above, the silicon substrate or the glass substrate may provide a high aspect ratio of the through hole, making the plating filling within the through hole difficult. Therefore, as shown in FIG. 3B, a sufficiently thick plating film 33 is temporarily formed on the seed layer 32. When the plating film 33 is formed, however, its stress may easily cause the warpage or crack to be generated in the substrate 31. Therefore, when the substrate 31 is thin, this technology may be difficult to apply.

Next, as shown in FIG. 3C, when plating is grown from the plating film 33, plating is also grown from the seed layer 32 deposited on the inner wall of the through hole. Therefore, when the opening of the through hole is blocked, the closed face inside the substrate is not flat but has a structure where the diameter of the through hole is reduced by the plating grown from the side wall of the through hole. Then, as shown in FIG. 3D, the growth of the plating is continued by supplying a plating liquid onto a blocked growth face 34. However, in this case, a void 35 may be generated on the blocked growth face 34.

Filling plating 36 grown in this manner should be polished by CMP or the like to planarize its surface. However, since the warpage of the substrate 31 may prevent the surface from being polished uniformly, as shown in FIG. 3F, a plating film 37 having the thickness substantially equal to that of the plating film 33 is formed on the filling plating 36, and the plating films 33 and 37 formed on both surfaces of the substrate 31 are then polished to generate the substrate 31 having a through electrode as shown in FIG. 3G.

As described above, according to the technology of PTL 1, since the plating is grown so as to swell from the bottom face by considering supply of the plating liquid into the through hole and its replacement, it may be possible to suppress the generation of the void compared with the traditional method in which the plating is laterally grown from the side face of the through hole.

However, it may be difficult to completely prevent the generation of the void, and a formation time of the portions that finally become unnecessary, including the formation of the plating film 33, the growth of the filling plating 36 and the formation of the plating film 37, and a process time for removing the portions may be increased, leading to an increase in process costs.

In light of such situations, the present disclosure provides a method for forming a through electrode free from a void even in a thin substrate.

Solution to Problem

According to an embodiment of the present disclosure, there is provided a method for manufacturing a wiring substrate with a through electrode, the method including providing a device substrate having a through hole, an opening of the through hole being blocked by a current supply path and the wiring substrate including the device substrate as a core layer with the through electrode; and disposing a first metal in the through hole to form the through electrode by electroplating, in a depth direction of the through hole, using the current supply path.

The device substrate may include an insulator material.

The method according to an embodiment of the present disclosure may further include: temporarily adhering a conductive substrate as the current supply path to a first surface of the device substrate by using a removable adhesive;

forming the through hole from a second surface of the device substrate to the conductive substrate; and removing the conductive substrate from the device substrate.

The conductive substrate may include a conductive base material or a conductive thin film formed on any base material.

The adhesive may be peelable by heating. In the peeling, after the through electrode is formed, the adhesive may be heated to enter a peelable state, and the conductive substrate may then be removed from the device substrate.

The forming of the through electrode may further include electroplating, in the depth direction of the through hole, using a second metal having a melting point lower than a melting point of the first metal, and by using the conductive substrate as the current supply path, wherein the second metal is formed to a thickness substantially equal to a thickness of the adhesive, and wherein the first metal is formed on the second metal in the depth direction of the through hole to form the through electrode.

The method according to an embodiment of the present disclosure may further include laminating a solder alloy on the through electrode.

The method according to an embodiment of the present disclosure may further include: forming an intermediate stopper layer on a first surface of the device substrate, forming wiring as the current supply path on the intermediate stopper layer, adhering a carrier substrate onto the wiring by using a removable adhesive, forming the through hole from a second surface of the device substrate to the wiring; and removing the carrier substrate from the wiring.

The intermediate stopper layer may include a material having a low dielectric constant and a low dielectric loss.

In the forming of the through hole, the intermediate stopper layer may be removed in a region that is narrower than the through hole until wiring is exposed.

The method according to an embodiment of the present disclosure may further include: planarizing a first surface of the device substrate by blocking the opening of the through hole formed in the device substrate; and forming a seed layer as the current supply path on the planarized surface of the device substrate.

In the planarization, the first surface of the device substrate may be planarized by blocking the opening of the through hole formed in the device substrate using a temporary filling agent.

In the planarization, the first surface of the device substrate may be planarized by adhering a first protective sheet onto the first surface of the device substrate, wherein the opening of the through hole is blocked using the temporary filling agent, and wherein the seed layer as the current supply path is formed on the planarized surface of the device substrate after the first protective sheet is removed.

In the forming of the seed layer, a portion of a second protective sheet may be adhered to the seed layer.

In the planarization, the first surface of the device substrate may be planarized by adhering sheet-shaped material to the first surface of the device substrate, and a portion of the adhered sheet-shaped material may be removed.

The method according to an embodiment of the present disclosure may further include: adhering the device substrate to a noble metal surface of an electrode substrate, wherein the noble metal surface is the current supply path.

A base material of the electrode substrate may include a flexible material, and wherein the noble metal surface includes at least one of Au, Pt, and Ti.

The noble metal surface may have surface roughness Rmax of 1 μm or more.

In a method for manufacturing a wiring substrate with a through electrode according to an embodiment of the present disclosure, one opening of a through hole formed in a device substrate to be a core layer of the wiring substrate with the through electrode is blocked, and first metal is grown by electroplating in a depth direction of the through hole from a plane of a current supply path having the plane perpendicular to the depth direction of the through hole to form a through electrode.

According to an embodiment of the present disclosure, there is provided a wiring substrate with a through electrode, the wiring substrate including a core layer in which the through electrode is formed; and a wiring layer provided in at least one surface of the core layer and connected to the through electrode, wherein the through electrode is formed such that an opening of a through hole formed in a device substrate is blocked by a current supply path, and a metal disposed in the through hole by electroplating in a depth direction of the through hole using the current supply path forms the through electrode.

Advantageous Effects of Invention

According to an embodiment of the present disclosure, it is possible to form a through electrode free from a void even in a thin substrate at a low cost.

BRIEF DESCRIPTION OF DRAWINGS

FIG. 7 is an explanatory diagram describing a process of a second manufacturing method to which an embodiment of the present disclosure is applied.

DESCRIPTION OF EMBODIMENTS

It should be understood by those skilled in the art that various modifications, combinations, sub-combinations and alterations may occur depending on design requirements and other factors insofar as they are within the scope of the appended claims or the equivalents thereof.

Hereinafter, the best mode for carrying out the present disclosure (hereinafter referred to as an embodiment) will be described with reference to the appended drawings.

<First Manufacturing Method for Wring Substrate with Trough Electrode to which Embodiment of Present Disclosure is Applied>

Figure 1:
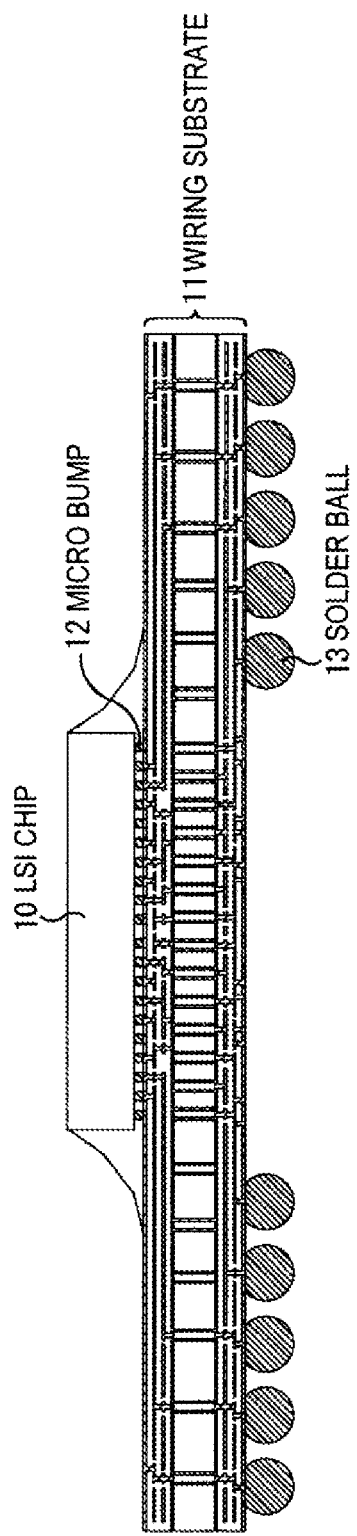
FIG. 1 is an explanatory diagram showing an example configuration of a mother board mounting a wiring substrate including an LSI chip.
Figure 2:
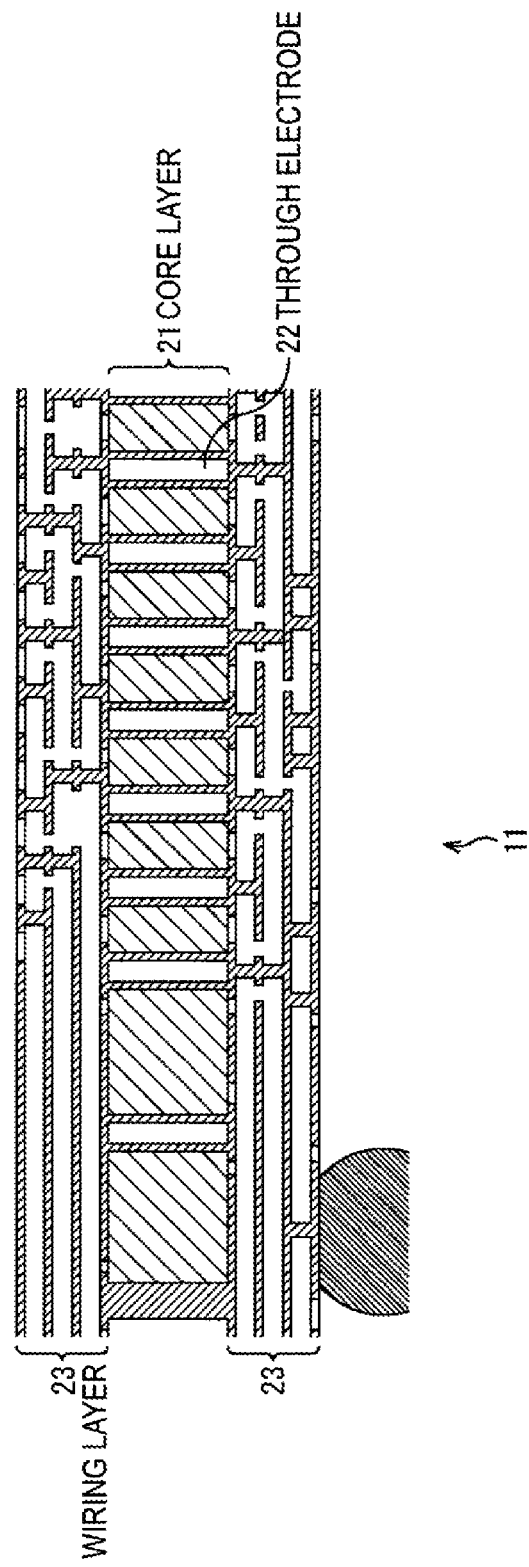
FIG. 2 is an explanatory diagram showing an example detailed configuration of the wiring substrate of FIG. 1.
Figure 3:
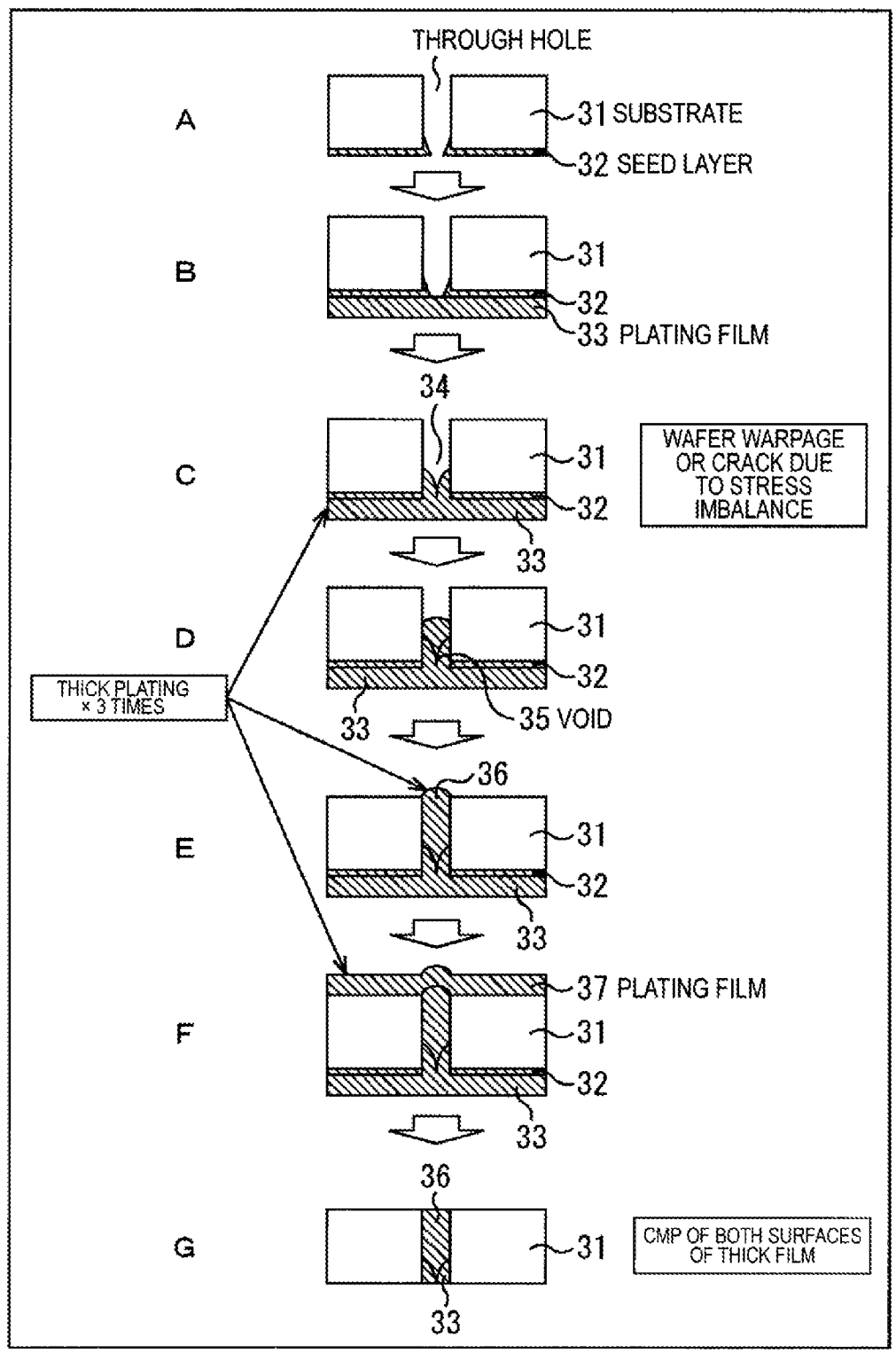
FIG. 3 is an explanatory diagram describing a technology proposed in PTL 1.
Figure 4:
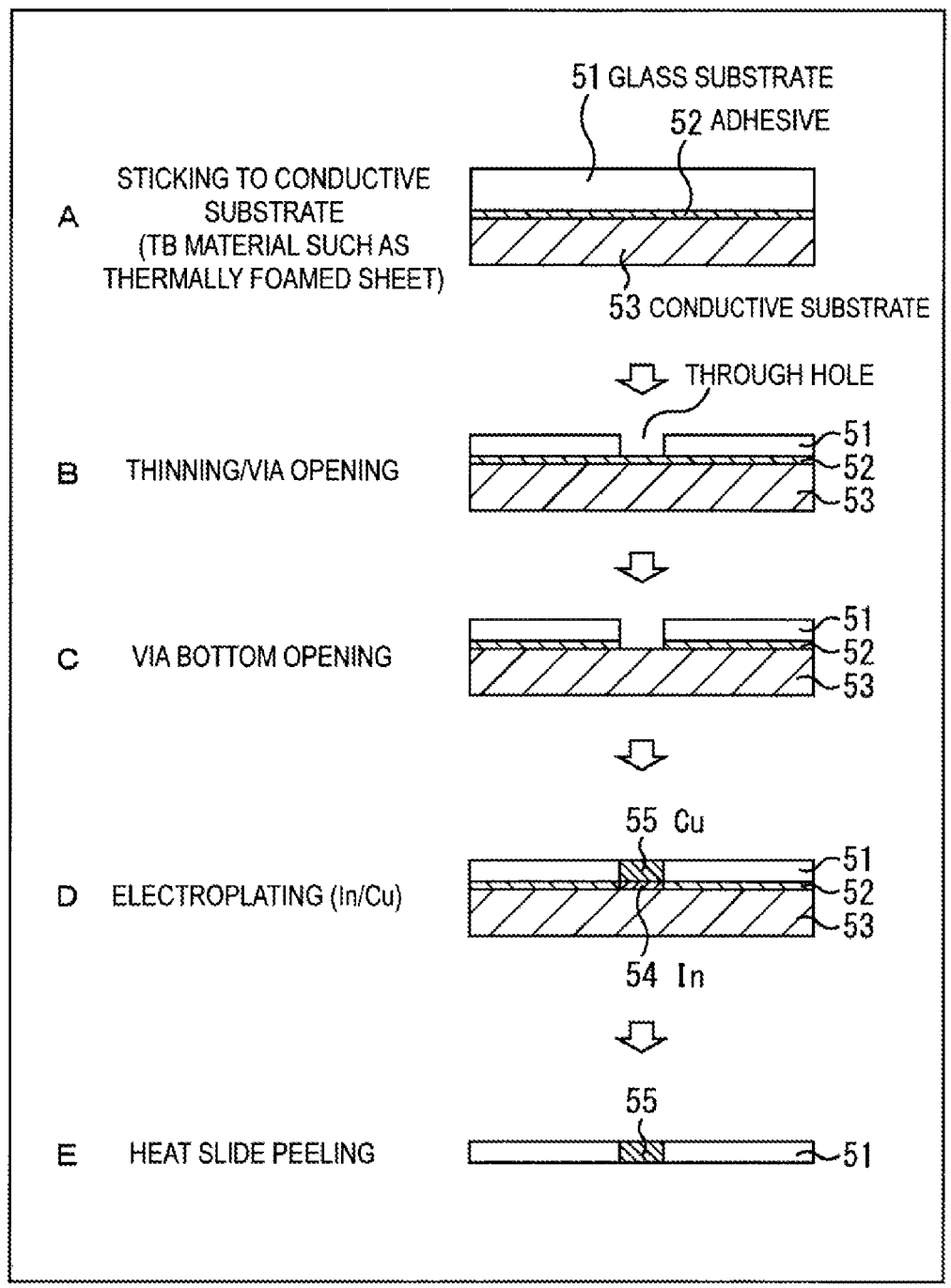
FIG. 4 is an explanatory diagram describing a process of a first manufacturing method to which an embodiment of the present disclosure is applied.

FIG. 4 shows a process describing a first manufacturing method for a wiring substrate with a through electrode to which an embodiment of the present disclosure is applied.

First, as shown in FIG. 4A, a conductive substrate 53 is temporarily adhered (stuck) by using an adhesive 52 to one surface of a glass substrate 51 to be a core layer of the wiring substrate with the through electrode.

The adhesive 52 is used that is resistant to an etchant for the glass substrate 51 and a chemical for plating to be subsequently filled in a through hole, or the like, and is capable of being peeled by heat after the growth of the plating. Specifically, the glass substrate 51 is adhered (stuck) to the conductive substrate 53, for example, by using a thermally foamed adhesive sheet.

The conductive substrate 53 may be one using a conductive material such as cupper as a core material, or one obtained by forming a metal thin film or the like on a surface of a substrate using an insulating material such as glass as a core material.

Next, as shown in FIG. 4B, when the wiring substrate with the through electrode to be finally obtained is desired to be reduced in plate thickness, the plate thickness of the glass substrate 51 is reduced to a desired thickness by slimming or the like. Although the glass substrate 51 as a single body may cause warpage or breakage when being reduced in plate thickness to less than 100 μm, the first manufacturing method in which the conductive substrate 53 is temporarily adhered (stuck) to the glass substrate 51 may prevent the occurrence of such a failure.

After the glass substrate 51 is reduced in thickness, a through hole for the through electrode is formed in the glass substrate 51 by etching or the like. Any method for etching the through hole may be used and, for example, the combination of irradiation of a pulse laser capable of forming a fine hole having high anisotropy and a high aspect ratio, and wet etching using a chemical may be used.

Next, as shown in FIG. 4C, the adhesive 52 remaining in the bottom portion of the through hole formed in the glass substrate 51 is removed by a chemical, plasma etching, or the like to expose the surface of the conductive substrate 53.

Next, as shown in FIG. 4D, in order to fill a conductor in the through hole, the through hole is filled by electroplating using the conductive substrate 53 as a current supply path. Specifically, low melting metal 54 such as indium (In) is grown at a thickness substantially equal to the thickness of the adhesive 52 (within +/−20%) by electroplating. Subsequently, cupper (Cu) to be a material of a through electrode 55 is filled therein similarly by electroplating to reach the surface of the glass substrate 51.

When the projection from the glass substrate 51 by the through electrode 55, and the variations in the projection cause trouble, the surface of the projected through electrode 55 may be planarized by light cutting using a surface planer or the like, or by light mechanical or chemical polishing.

Finally, as shown in FIG. 4E, the glass substrate 51 and the conductive substrate 53 that are temporarily adhered (stuck) to each other are heated by a hot plate or the like to reduce the sticking force of the adhesive 52 and melt the low melting metal 54 to separate both from each other. Furthermore, when the low melting metal 54 deposited on the glass substrate 51 is washed by a chemical, such as hydrochloric acid, having a selection ratio to the through electrode 55 composed of Cu, the core layer with the through electrode (the glass substrate 51 having the through electrode 55 formed therein) can be obtained.

Figure 5:
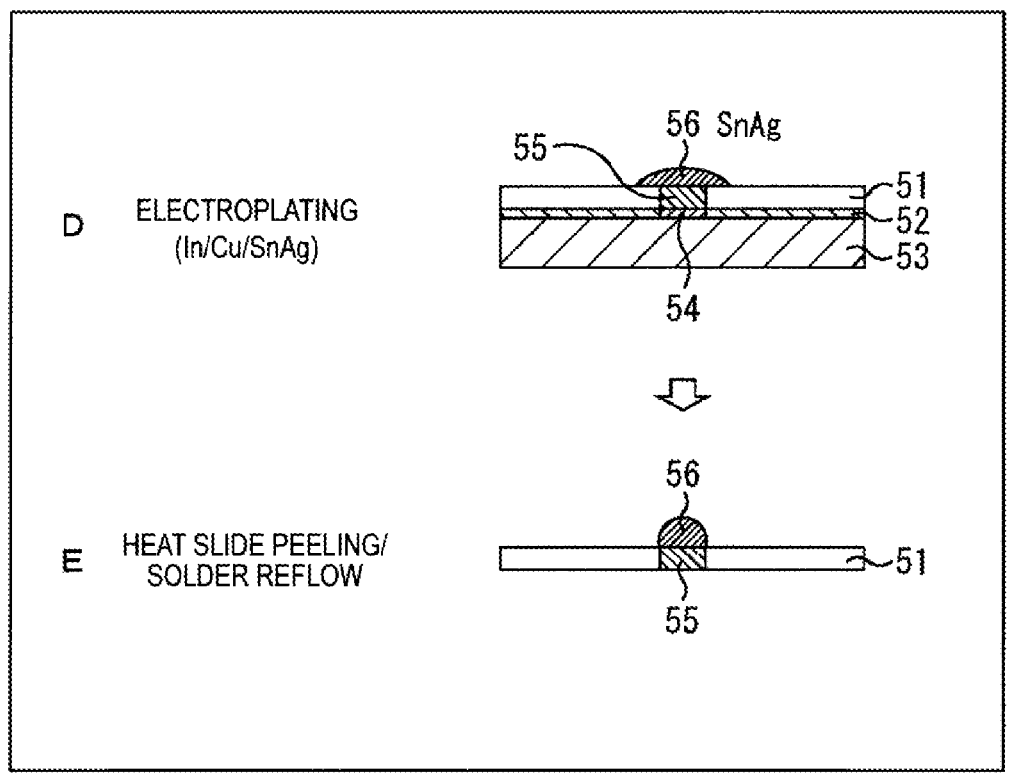
FIG. 5 is an explanatory diagram describing a modification of the process of the first manufacturing method.

Note that, when a secondary connection side of the formed core layer with through electrode is connected to the mother board by not using wiring but the through electrode 55, the steps in FIGS. 4D and 4E may be replaced with the steps in FIGS. 5D and 5E. That is, a plating solder ball 56 for connection may be formed in a maskless manner by plating and reflowing solder alloy such as Sn—Ag or the like for connection.

Figure 6:
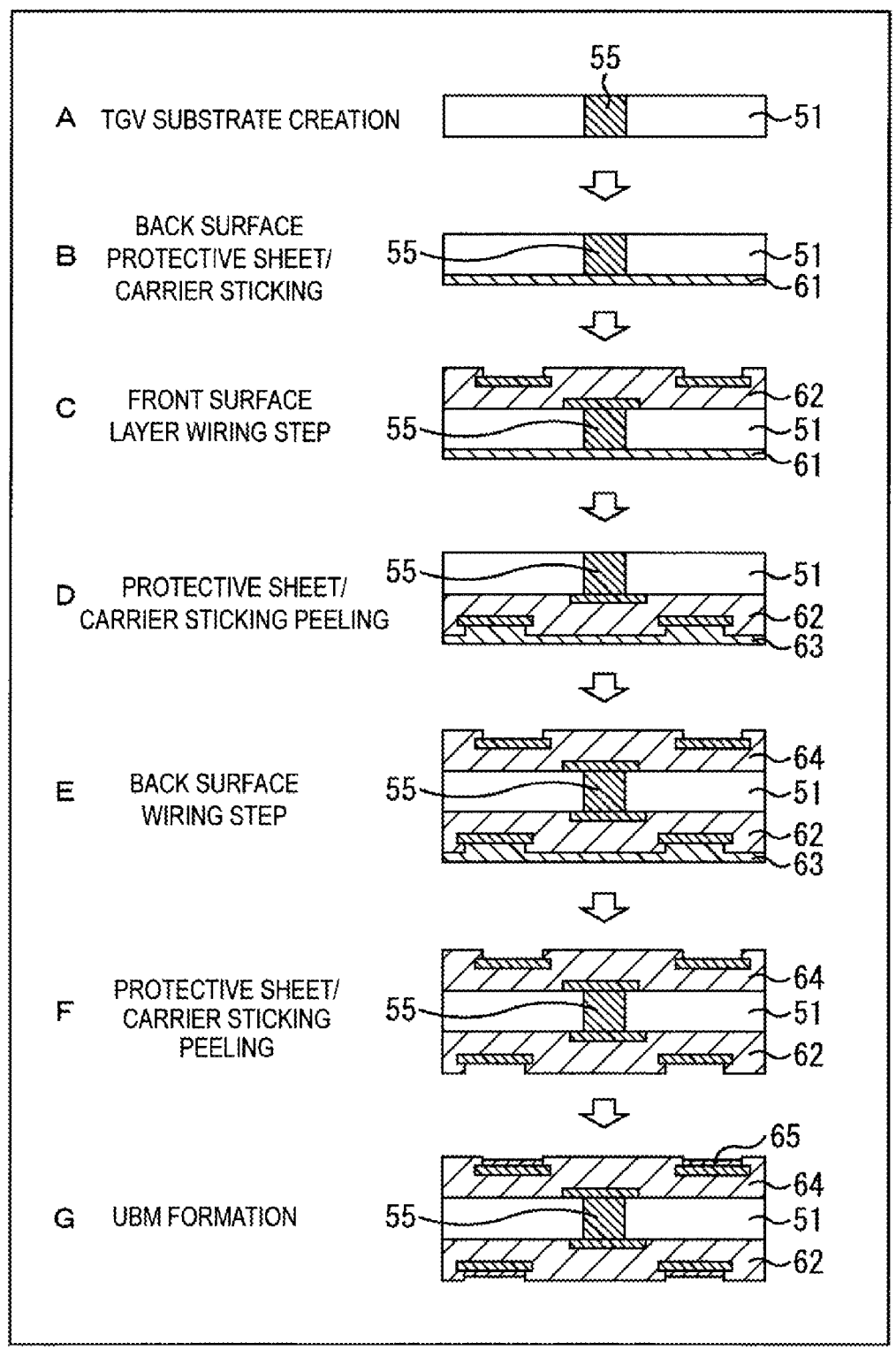
FIG. 6 is an explanatory diagram describing a process of a first manufacturing method to which an embodiment of the present disclosure is applied.

FIG. 6 shows a step of forming a wiring layer on a front surface side and a back surface side of the core layer with the through electrode manufactured by the step shown in FIG. 4 to manufacture the wiring substrate with the through electrode.

As shown in FIG. 6B, a protective sheet 61 is adhered (stuck) to the back surface side of the core layer with the through electrode (the glass substrate 51 having the through electrode 55 formed therein) shown in FIG. 6A, and front layer wiring 62 is then formed on the front surface side thereof as shown in FIG. 6C.

Next, as shown in FIG. 6D, a protective sheet 63 is adhered (stuck) onto the front layer wiring 62, and the protective sheet 61 on the back surface side is peeled, and as shown in FIG. 6E, after the peeling, back layer wiring 64 is formed on the back surface side, and as shown in FIG. 6F, the protective sheet 63 on the front surface side is peeled.

Finally, as shown in FIG. 6G, under bump metal (UBM) to be a barrier layer for solder and a wiring material is formed on a pad portion for a component of the front layer wiring 62 and the back layer wiring 64. The wiring substrate with the through electrode is manufactured by the above-described steps.

<Second Manufacturing Method for Wring Substrate with Trough Electrode to which Embodiment of Present Disclosure is Applied>

Next, FIG. 7 shows a process describing a second manufacturing method for a wiring substrate with a through electrode to which an embodiment of the present disclosure is applied.

First, as shown in FIG. 7A, an intermediate layer 72 to be a stopper in etching is formed on one surface of the glass substrate 51 to be a core layer of the wiring substrate with the through electrode, and wiring 73 composed of a metal material for connecting it with the through electrode is formed thereon. Note that the intermediate layer 72 may be formed on both surfaces of the glass substrate 51.

It is desirable to apply a material having a selection ratio to etching of glass to the intermediate layer 72. Specifically, for example, when hydrofluoric acid-based etching is performed, metal such as molybdenum (Mo) or Cu, semiconductor such as amorphous silicon (a-Si), an insulator such as silicon nitride, or the like may be applied.

When the intermediate layer 72 is provided, depending on the selection of its material, the effect can be expected including the prevention of impurity diffusion of alkaline ions or the like, the reduction in signal loss at a high frequency due to a low-k/low-tan Δ material, or the reduction in sheet resistance due to the use of a conductive material.

Furthermore, a carrier substrate 75 for protecting the surface of the wiring 73 is adhered (stuck) to the glass substrate 71 by using an adhesive 74. The adhesive 74 may be a material having plating resistance, and facilitating peeling after plating filling. When the glass substrate 71 is formed thinly, a rigid glass plate, or the like may be used for the carrier substrate 75. When it is not necessary to form the glass substrate 71 thinly, a material in a film form such as polyimide may be used for the carrier substrate 75.

Next, as shown in FIG. 7B, when the plate thickness of the wiring substrate with the through electrode to be finally obtained is desired to be thin, the glass substrate 71 is formed thinly so as to obtain a desired thickness by using slimming or the like. Next, a through hole is formed in the thinned glass substrate 71 so as to reach the intermediate layer 72 by etching or the like. A taper angle of the through hole may be less than 90 degrees.

Subsequently, as shown in FIG. 7C, with a processing method corresponding to a material of the intermediate layer 72, the wiring is exposed by removing the intermediate layer 72 within the through hole. However, when the intermediate 72 itself is a conductive material capable of electrically contacting the through electrode such as cupper plating to be subsequently filled, the intermediate layer 72 may not be removed.

Note that, when the intermediate layer 72 is removed, as shown on a right side of FIG. 7C, the intermediate layer 72 may be removed using a mask having a diameter less than that of the through hole. This allows such a structure to be formed that the wiring 73 does not directly contact a stress concentration portion at the edge of the through hole due to mismatching in thermal expansion coefficient between a metal material such as Cu plating to be filled in the through hole and the glass substrate 71, thereby improving reliability of the wiring 73 against thermal cycle stress or the like.

Next, as shown in FIG. 7D, the exposed wiring 73 is used as a current supply path for electroplating to perform filling plating for filling Cu to be a through electrode 76 in the through hole. The filling plating of Cu is performed until the through electrode 76 reaches the surface on a side of the glass substrate 71, and when the projection of the through electrode 76, and the variations in the projection cause trouble, the surface of the projected through electrode 76 may be planarized by light cutting using a surface planer or the like, or by light mechanical or chemical polishing.

Next, as shown FIG. 7E, a carrier substrate 78 is adhered (stuck) to the planarized surface of the glass substrate 71 by using an adhesive 77, and the carrier substrate 75 adhered (stuck) to the opposite surface is peeled.

Finally, as shown in FIG. 7F, the wiring 73 exposed to the surface is processed to obtain the first layer of the wiring layer connected to the through electrode 76. Thereafter, the wiring layer may be multilayered as necessary. Note that, when a secondary connection side of the generated core layer with the through electrode is connected to the mother board by not using wiring but a TGV, a plating solder ball for connection may be formed in a maskless manner by plating and reflowing solder alloy such as Sn—Ag or the like for connection, after the step shown in FIG. 7D. The wiring substrate with the through electrode is generated by the above-described steps.

<Third Manufacturing Method for Wring Substrate with Trough Electrode to which Embodiment of Present Disclosure is Applied>

Figure 8:
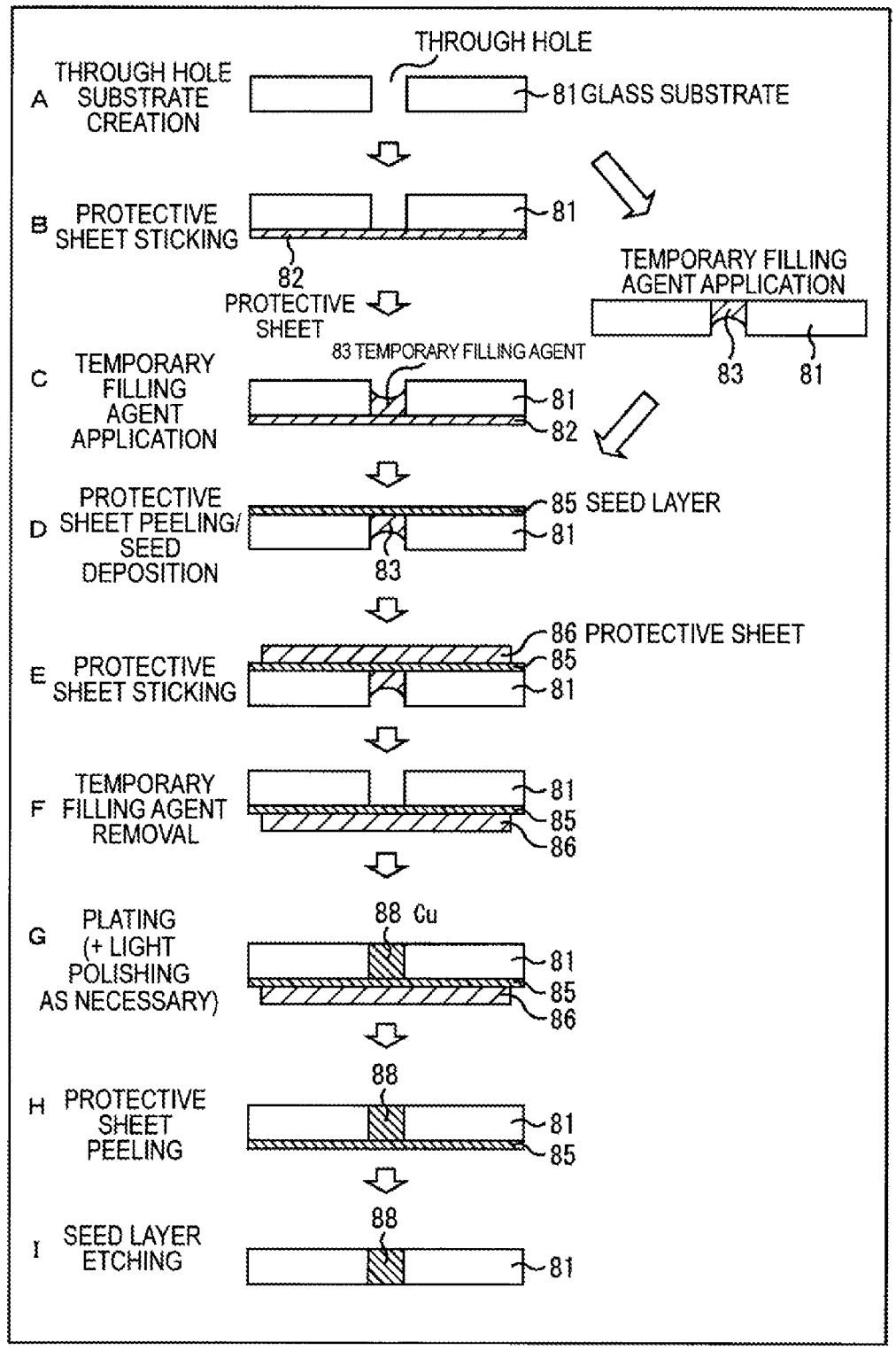
FIG. 8 is an explanatory diagram describing a process of a third manufacturing method to which an embodiment of the present disclosure is applied.

Next, FIG. 8 shows a process describing a third manufacturing method for a wiring substrate with a through electrode to which an embodiment of the present disclosure is applied.

First, as shown in FIG. 8A, a through hole is formed in a glass substrate 81 to be a core layer of the wiring substrate with the through electrode by any processing method. A taper angle of the through hole may be less than 90 degrees.

Next, as shown in FIG. 8B, a protective sheet 82 for blocking the through hole to form a pseudo bottomed structure is temporarily adhered (stuck) to one surface of the glass substrate 81 having the through hole formed therein. A material of the protective sheet 82 may be one not fused to a temporary filling agent to be subsequently filled in the through hole, and having a satisfactory peeling property.

Next, as shown in FIG. 8C, a temporary filling agent 83 is applied or injected from a side of the opening surface into the through hole formed into the pseudo bottomed structure by the protective sheet 82 to fill the bottom portion of the through hole with the temporary filling agent 83, and the protective sheet 82 is then peeled. This makes it possible to obtain such a structure that at least one surface side of the through hole is flatly filled with the temporary filling agent 83. Note that a similar structure may be obtained using screen printing by adjusting viscosity or the like of the temporary filling agent 83 without carrying out the step of forming the pseudo bottomed structure by using the protective sheet 82.

Subsequently, as shown in FIG. 8D, a seed layer 85 for electroplating is formed on the surface side where the through hole is flatly filled. A metal thin film (Ti, Cu or the like) formed by typical sputtering may be used for the seed layer 85. Then, as shown in FIG. 8E, a protective sheet 86 may be adhered (stuck) to the top of the seed layer 85 as necessary. The protective sheet 86 may be a material having intensity capable of maintaining the pseudo bottomed structure even after removing the temporary filling agent as described later, and having resistance to subsequent plating, and may use, for example, an Interimer (registered trademark) film. Note that it is possible to expose a portion of the seed layer 85 formed on the glass substrate 81 as a current supply path for electroplating by forming the protective sheet 85 smaller than the glass substrate 81 and the seed layer 85.

Next, as shown in FIG. 8F, the temporary filling agent 83 is removed by a solvent, a chemical or the like from the opening surface side of the through hole to expose the seed layer 85 in the bottom portion of the through hole, and as shown in FIG. 8G, filling plating of Cu is performed in order to fill a conductor in the through hole. The filling plating of Cu is performed until the through electrode 88 reaches the surface of the glass substrate 81, and when the projection of the through electrode 88, and the variations in the projection cause trouble, the surface of the projected through electrode 88 may be planarized by light cutting using a surface planer or the like, or by light mechanical or chemical polishing.

Subsequently, as shown in FIG. 8H, the protective sheet 86 is peeled, and as shown in FIG. 8I, the seed layer 85 is removed by etching or the like to obtain the core layer with the through electrode (the glass substrate 81 having the through electrode 88 formed therein). When subsequent wiring formation is performed by a semi-additive method or the like, however, the seed layer 85 may not be removed but be left as it is and used as the seed layer for a wiring layer.

Since a step of forming the wiring layer on the front surface side and the back surface side of the core layer with the through electrode manufactured by the third manufacturing method shown in FIG. 8 to manufacture the wiring substrate with the through electrode is similar to the step shown in FIG. 6, the description is omitted.

<Fourth Manufacturing Method for Wring Substrate with Trough Electrode to which Embodiment of Present Disclosure is Applied>

Figure 9:
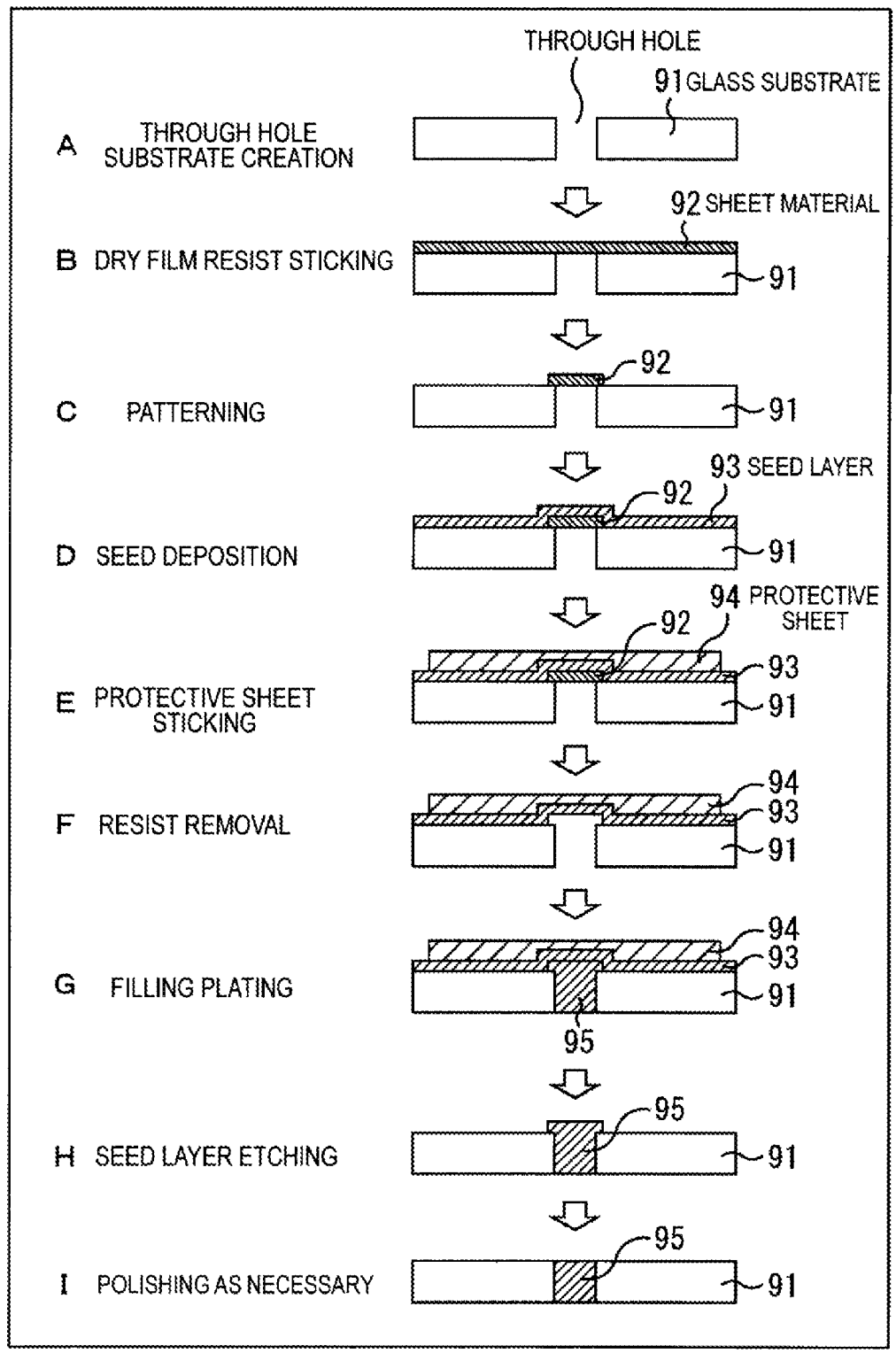
FIG. 9 is an explanatory diagram describing a process of a fourth manufacturing method to which an embodiment of the present disclosure is applied.

Next, FIG. 9 shows a process describing a fourth manufacturing method for a wiring substrate with a through electrode to which an embodiment of the present disclosure is applied.

First, as shown in FIG. 9A, a through hole is formed in a glass substrate 91 to be a core layer of the wiring substrate with the through electrode by any processing method. A taper angle of the through hole may be less than 90 degrees.

Next, as shown in FIG. 9B, a sheet material 92 for blocking the through hole to form a pseudo bottomed structure is temporarily adhered (stuck) to one surface of the glass substrate 91 having the through hole formed therein, and as shown in FIG. 9C, the temporarily adhered (stuck) sheet material 92 is processed into the pseudo bottomed structure a size larger than the through hole by patterning of mask exposure, development and the like. Note that the sheet material 92 may be a material and be of a film thickness, capable of being processed by exposure and the like, and maintaining the bottomed structure even after a subsequent sputtering step, and may use, for example, a typical dry film resist.

Next, as shown in FIG. 9D, a seed layer 93 for electroplating is formed on the one surface of the glass substrate 91 including the processed sheet material 92. A metal thin film (Ti, Cu or the like) formed by typical sputtering may be used for the seed layer 93. Subsequently, as shown in FIG. 9E, a protective sheet 94 is adhered (stuck) to the top of the seed layer 93 as necessary. The protective sheet 94 may be a material having intensity capable of maintaining the pseudo bottomed structure even after removing the temporary filling agent as described later, and having resistance to subsequent plating, and may use, for example, an Interimer (registered trademark) film. Note that it is possible to expose a portion of the seed layer 93 formed on the glass substrate 91 as a current supply path for electroplating by forming the protective sheet 94 smaller than the glass substrate 91 and the seed layer 93.

Next, as shown in FIG. 9F, the sheet material 92 processed into the pseudo bottomed structure is removed by a solvent, or the like from the opening surface side of the through hole to expose the seed layer 93 in the bottom portion of the through hole. Thereafter, as shown in FIG. 9G, filling plating of Cu is performed in order to fill a conductor in the through hole. The filling plating of Cu is performed until a through electrode 95 reaches the surface of the glass substrate 91, and when the projection of the through electrode 95, and the variations in the projection cause trouble, the surface of the projected through electrode 95 may be planarized by light cutting using a surface planer or the like, or by light mechanical or chemical polishing.

Subsequently, as shown in FIG. 9H, the protective sheet 94 is peeled, and the seed layer 93 is removed by etching or the like. Finally, as shown in FIG. 9I, the through electrode 95 is polished as necessary to obtain the core layer with the through electrode (the glass substrate 91 having the through electrode 95 formed therein). When subsequent wiring formation is performed by a semi-additive method or the like, however, the seed layer 93 may not be removed but be left as it is and used as the seed layer for a wiring layer.

Since a step of forming the wiring layer on the front surface side and the back surface side of the core layer with the through electrode manufactured by the fourth manufacturing method shown in FIG. 9 to manufacture the wiring substrate with the through electrode is similar to the step shown in FIG. 6, the description is omitted.

<Fifth Manufacturing Method for Wring Substrate with Trough Electrode to which Embodiment of Present Disclosure is Applied>

Figure 10:
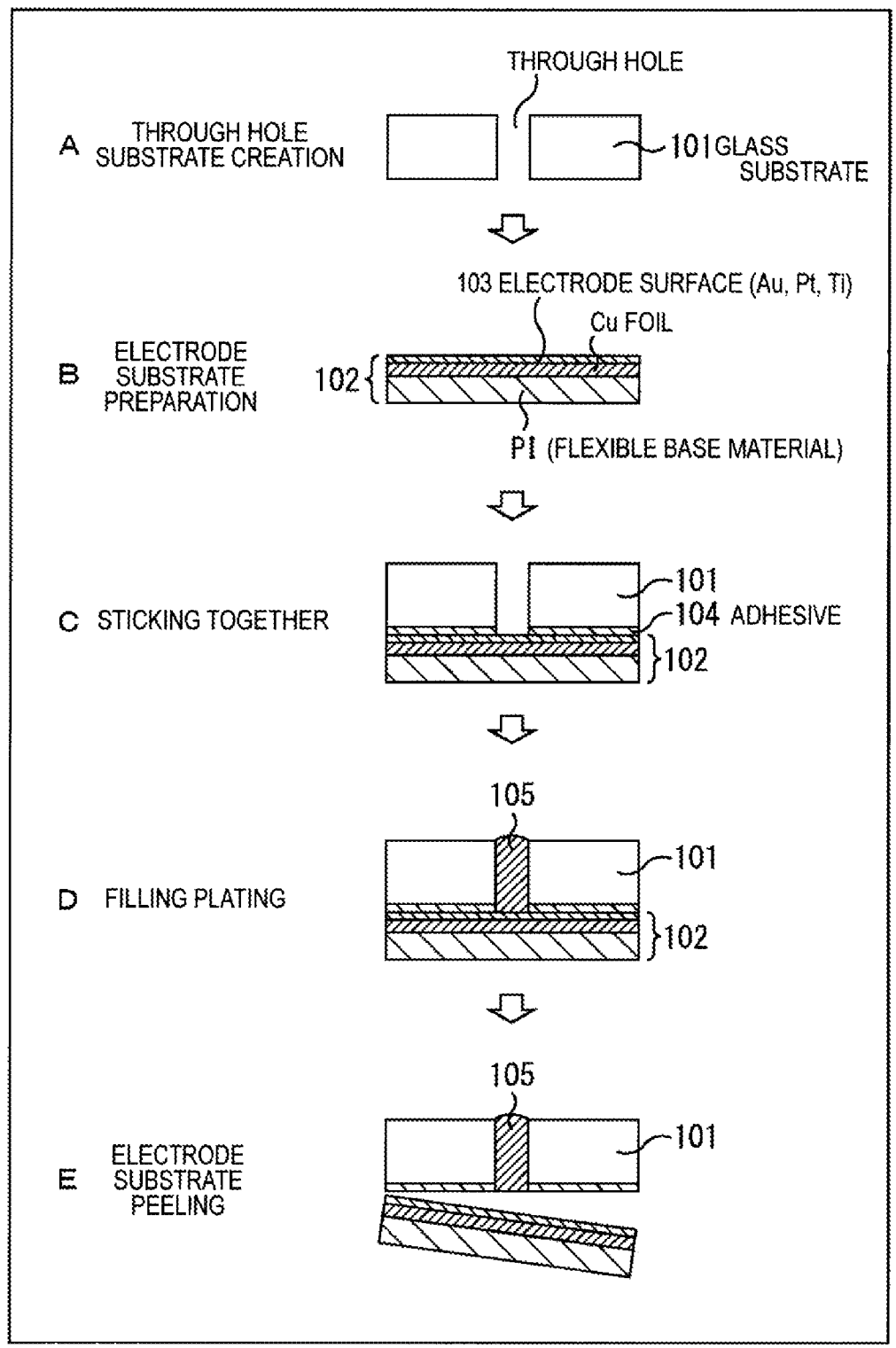
FIG. 10 is an explanatory diagram describing a process of a fifth manufacturing method to which an embodiment of the present disclosure is applied.

Next, FIG. 10 shows a process describing a fifth manufacturing method for a wiring substrate with a through electrode to which an embodiment of the present disclosure is applied.

First, as shown in FIG. 10A, a through hole is formed in a glass substrate 101 to be a core layer of the wiring substrate with the through electrode by any processing method. A taper angle of the through hole may be less than 90 degrees.

Meanwhile, as shown in FIG. 10B, an electrode substrate 102, which is temporarily adhered (stuck) to the glass substrate 101 and is to be a current supply path for electroplating, is separately prepared. The electrode substrate 102 is formed in order to facilitate peeling from the glass substrate 101 at a subsequent step, by using as a base material a material having flexibility such as a polyimide film with a cupper foil, and forming on the base material an electrode surface 103 composed of noble metal having low adhesion to Cu of fulling plating to be performed at a subsequent step, such as gold (Au), platinum (Pt), titanium (Ti) or the like, with a sputtering method or the like. Note that, if the electrode surface 103 is formed so as to obtain surface roughness Rmax of 1 μm or more, since the electrode substrate 102 is more easily peeled from the glass substrate 101, the base material for the electrode substrate 102 may not necessarily have flexibility.

Subsequently, as shown in FIG. 10C, the glass substrate 101 and the electrode substrate 102 are adhered (stuck) to each other so that the electrode surface 103 of the electrode substrate 102 is disposed in the bottom portion of the through hole of the glass substrate 101, to form a pseudo bottomed structure in the through hole. Both may be adhered (stuck) to each other by using such a tool as to closely attach both together, or using an adhesive 104. When the adhesive 104 is used, after both are adhered (stuck) to each other, the adhesive 104 that resides in the bottom portion of the pseudo bottomed structure is removed so as to expose the electrode surface 103 of the electrode substrate 102.

Next, as shown in FIG. 10D, filling plating of Cu is performed in order to fill a conductor in the through hole. The filling plating of Cu is performed until a through electrode 105 reaches the surface of the glass substrate 101, and when the projection of the through electrode 105, and the variations in the projection cause trouble, the surface of the projected through electrode 95 may be planarized by light cutting using a surface planer or the like, or by light mechanical or chemical polishing.

Finally, as shown in FIG. 10E, the electrode substrate 102 is peeled, and when the adhesive 104 is used, the adhesive 104 is also removed to obtain the core layer with through electrode (the glass substrate 101 having the through electrode 105 formed therein). Note that the core layer with the through electrode obtained in this manner, which has low adhesion between the through electrode 105 and the glass substrate 101, may be used again.

Since a step of forming the wiring layer on the front surface side and the back surface side of the core layer with the through electrode manufactured by the fifth manufacturing method shown in FIG. 10 to manufacture the wiring substrate with the through electrode is similar to the step shown in FIG. 6, the description is omitted.

SUMMARY

According to the first to fifth methods for manufacturing the wiring substrate with the through electrode as described above, the flat shape of the filling plating of Cu or the like used for the through electrode at the starting point of the growth may prevent a void from being generated within the filling plating to improve a yield and reliability of the wiring substrate with the through electrode.

Furthermore, since the traditionally-used step of forming the thick plating film on the substrate surface is skipped and no thick plating layer is transiently formed on one side of the substrate, even when the through electrode is formed in a thin glass substrate, the risk of the warpage or break of a wafer may be reduced to eliminate a restriction on the plate thickness of the substrate. Further, the absence of the step of forming the thick plating layer may eliminate the necessity for the step of removing the thick plating layer by polishing or the like to facilitate an increase in size of the wafer.

The embodiments of the present disclosure are not limited to the above-described embodiments, and various modifications are possible without departing from the spirit of the present disclosure.

Additionally, the present technology may also be configured as below.

(1)

A method for manufacturing a wiring substrate with a through electrode, the method including blocking one opening of a through hole formed in a device substrate to be a core layer of the wiring substrate with the through electrode, and growing first metal by electroplating in a depth direction of the through hole from a plane of a current supply path having the plane perpendicular to the depth direction of the through hole to form a through electrode.

(2)

The method according to (1), wherein the device substrate is composed of insulator material.

(3)

The method according to (1) or (2), further including:
before the forming of the through electrode,
temporarily sticking a conductive substrate as the current supply path to one surface of the device substrate by using a peelable adhesive; and
forming the through hole from the other surface of the device substrate to which the conductive substrate is not temporarily stuck, until the conductive substrate is exposed; and
after the forming of the through electrode,
peeling the conductive substrate from the device substrate.

(4)

The method according to (3), wherein the conductive substrate is composed of conductive base material, or is composed of a conductive thin film formed on any base material.

(5)

The method according to (3) or (4),
wherein the adhesive is peelable by heating, and
wherein in the peeling, after the through electrode is formed, the adhesive is heated to enter a peelable state, and the conductive substrate is then peeled from the device substrate.

(6)

The method according to any of (3) to (5), wherein in the forming of the through electrode, second metal having a melting point lower than the melting point of the first metal is grown by electroplating from the plane of the conductive substrate as the current supply path in the depth direction of the through hole at a film thickness substantially equal to the thickness of the adhesive, and the first metal is then grown on the second metal in the depth direction of the through hole to form the through electrode.

(7)

The method according to any of (1) to (6), further including:
after the forming of the through electrode,
laminating solder alloy on the formed through electrode.

(8)

The method according to (1) or (2), further including:
before the forming of the through electrode,
forming an intermediate layer to be a stopper that is used when the through hole is formed in one surface of the device substrate;
forming wiring as the current supply path on the intermediate layer;
sticking a carrier substrate onto the wiring by using a peelable adhesive; and
forming the through hole from the other surface of the device substrate on which the intermediate layer is not formed; and after the forming of the through electrode, peeling the carrier substrate from the wiring.

(9)
The method according to (8), wherein the intermediate layer is composed of any of material having a selection ratio to etching of the through hole, conductive material, material suppressing diffusion of metal elements including alkali, and material having a low dielectric constant and a low dielectric loss.

(10)
The method according to (8) or (9), wherein in the forming of the through hole, after the through hole is formed by etching the device substrate from the other surface of the device substrate on which the intermediate layer is not formed, the intermediate layer is removed in a region narrower than the through hole until the wiring is exposed.

(11)
The method according to (1) or (2), further including:
before the forming of the through electrode,
planarizing one surface of the device substrate by blocking the one opening of the through hole formed in the device substrate; and
forming a seed layer as the current supply path on the planarized one surface of the device substrate.

(12)
The method according to (11), wherein in the planarization, the one surface of the device substrate is planarized by blocking the one opening of the through hole formed in the device substrate by using a temporary filling agent having an etching selection ratio to the seed layer.

(13)
The method according to (12),
wherein in the planarization, the one surface of the device substrate is planarized by sticking a first protective sheet onto the one surface of the device substrate in which the through hole is formed, and blocking the one opening of the through hole to which the first protective sheet is stuck, by using the temporary filling agent, and
wherein in the forming of the seed layer, after the first protective sheet is removed, the seed layer as the current supply path is formed on the planarized one surface of the device substrate.

(14)
The method according to any of (11) to (13), wherein in the forming of the seed layer, a second protective sheet is stuck onto the formed seed layer except for a current application portion.

(15)
The method according to (11) to (14), wherein in the planarization, the one surface of the device substrate is planarized by sticking sheet-shaped material having an etching selection ratio to the seed layer onto the one surface of the device substrate, and removing the stuck sheet-shaped material except for the peripheral portion of the through hole.

(16)
The method according to (1) or (2), further including:
before the forming of the through electrode,
sticking the device substrate in which the through hole is formed, to a noble metal surface of an electrode substrate having the noble metal surface as the current supply path on its front surface layer.

(17)
The method according to (16),
wherein a base material of the electrode substrate is composed of flexible material, and wherein the noble metal surface is composed of any of Au, Pt, and Ti.

(18)
The method according to (16) or (17), wherein the noble metal surface has surface roughness Rmax of 1 µm or more.

(19)
A wiring substrate with a through electrode, the wiring substrate including:
a core layer in which the through electrode is formed; and
a wiring layer provided in at least one surface of the core layer and connected to the through electrode,
wherein the through electrode is formed by blocking one opening of a through hole formed in a device substrate to be the core layer, and growing metal by electroplating in a depth direction of the through hole from a plane of a current supply path having the plane perpendicular to the depth direction of the through hole.

(20)
A method for manufacturing a wiring substrate with a through electrode, the method including providing a device substrate having a through hole, an opening of the through hole being blocked by a current supply path and the wiring substrate including the device substrate as a core layer with the through electrode; and
disposing a first metal in the through hole to form the through electrode by electroplating, in a depth direction of the through hole, using the current supply path.

(21)
The method according to (20), wherein the device substrate includes an insulator material.

(22)
The method according to (20) or (21), further including:
temporarily adhering a conductive substrate as the current supply path to a first surface of the device substrate by using a removable adhesive;
forming the through hole from a second surface of the device substrate to the conductive substrate; and
removing the conductive substrate from the device substrate.

(23)
The method according to (22) above, wherein the conductive substrate includes a conductive base material or a conductive thin film formed on any base material.

(24)
The method according to (22) or (23), further including:
heating the adhesive to a peelable state; and
removing the conductive substrate from the device substrate.

(25)
The method according to any one of (22) to (24) above, further including: electroplating, in the depth direction of the through hole, using a second metal having a melting point lower than a melting point of the first metal, and by using the conductive substrate as the current supply path, wherein the second metal is formed to a thickness substantially equal to a thickness of the adhesive, and wherein the first metal is formed on the second metal in the depth direction of the through hole to form the through electrode.

(26)
The method according to any one of (20) to (25) above, further including: laminating a solder alloy on the through electrode.

(27)
The method according to (20) or (21), further including:
forming an intermediate stopper layer on a first surface of the device substrate;
forming wiring as the current supply path on the intermediate stopper layer;

adhering a carrier substrate onto the wiring by using a removable adhesive;

forming the through hole from a second surface of the device substrate to the wiring;

and removing the carrier substrate from the wiring.

(28)

The method according to (27), wherein the intermediate stopper layer includes a material having a low dielectric constant and a low dielectric loss.

(29)

The method according to (27) or (28), further including:

removing the intermediate stopper layer in a region that is narrower than the through hole until wiring is exposed.

(30)

The method according to (20) or (21), further including:

planarizing a first surface of the device substrate by blocking the opening of the through hole formed in the device substrate; and forming a seed layer as the current supply path on the planarized surface of the device substrate.

(31)

The method according to (30), wherein the first surface of the device substrate is planarized by blocking the opening of the through hole formed in the device substrate using a temporary filling agent.

(32)

The method according to (31), wherein the first surface of the device substrate is planarized by adhering a first protective sheet onto the first surface of the device substrate, wherein the opening of the through hole is blocked using the temporary filling agent, and wherein the seed layer as the current supply path is formed on the planarized surface of the device substrate after the first protective sheet is removed.

(33)

The method according to any one of (30) to (32) above, wherein a portion of a second protective sheet is adhered to the seed layer.

(34)

The method according to any one of (30) to (33) above, wherein the first surface of the device substrate is planarized by adhering sheet-shaped material to the first surface of the device substrate, and a portion of the adhered sheet-shaped material is removed.

(35)

The method according to (20) or (21), further including:

adhering the device substrate to a noble metal surface of an electrode substrate, wherein the noble metal surface is the current supply path.

(36)

The method according to (35), wherein a base material of the electrode substrate includes a flexible material, and wherein the noble metal surface includes at least one of Au, Pt, and Ti.

(37)

The method according to (35) or (36), wherein a surface roughness Rmax of the noble metal surface is 1 µm or more.

(38)

A wiring substrate with a through electrode, the wiring substrate including:

a core layer in which the through electrode is formed; and a wiring layer provided in at least one surface of the core layer and connected to the through electrode, wherein the through electrode is formed such that an opening of a through hole formed in a device substrate is blocked by a current supply path, and a metal disposed in the through hole by electroplating in a depth direction of the through hole using the current supply path forms the through electrode.

REFERENCE SIGNS LIST 51 glass substrate
52 adhesive
53 conductive substrate
54 low melting metal
55 through electrode
56 solder ball
62 front layer wiring
64 back layer wiring
71 glass substrate
72 intermediate layer
73 wiring
74 adhesive
75 carrier substrate
76 through electrode
77 adhesive
78 carrier substrate
81 glass substrate
82 protective sheet
83 temporary filling agent
85 seed layer
86 protective sheet
88 through electrode
91 glass substrate
92 sheet material
93 seed layer
94 protective sheet
95 through electrode
101 glass substrate
102 electrode substrate
103 electrode surface
104 adhesive
105 through electrode

What is claimed is:

1. A method for manufacturing a wiring substrate including a through electrode, the method comprising:

providing a device substrate having a through hole, an opening of the through hole being blocked by a current supply path and the wiring substrate including the device substrate as a core layer with the through electrode, wherein the device substrate includes an insulator material;

disposing a first metal in the through hole to form the through electrode by electroplating, in a depth direction of the through hole, using the current supply path;

temporarily adhering a conductive substrate as the current supply path to a first surface of the device substrate by using a removable adhesive;

forming the through hole from a second surface of the device substrate to the conductive substrate;

electroplating, in the depth direction of the through hole, using a second metal having a melting point lower than a melting point of the first metal, and by using the conductive substrate as the current supply path, wherein the second metal is formed to a thickness substantially equal to a thickness of the adhesive, and wherein the first metal is formed on the second metal in the depth direction of the through hole to form the through electrode; and removing the conductive substrate from the device substrate.

2. The method according to claim 1, wherein the conductive substrate includes a conductive base material or a conductive thin film formed on any base material.

3. The method according to claim 1, further comprising:
heating the adhesive to a peelable state; and
removing the conductive substrate from the device substrate.

4. The method according to claim 1, further comprising:
laminating a solder alloy on the through electrode.

5. A method for manufacturing a wiring substrate including a through electrode, the method comprising:
providing a device substrate having a through hole, an opening of the through hole being blocked by a current supply path and the wiring substrate including the device substrate as a core layer with the through electrode, wherein the device substrate includes an insulator material;
disposing a first metal in the through hole to form the through electrode by electroplating, in a depth direction of the through hole, using the current supply path;
forming an intermediate stopper layer on a first surface of the device substrate;
forming wiring as the current supply path on the intermediate stopper layer;
adhering a carrier substrate onto the wiring by using a removable adhesive;
forming the through hole from a second surface of the device substrate to the wiring; and
removing the carrier substrate from the wiring.

6. The method according to claim 5, wherein the intermediate stopper layer includes a material having a low dielectric constant and a low dielectric loss.

7. The method according to claim 5, further comprising:
removing the intermediate stopper layer in a region that is narrower than the through hole until wiring is exposed.

8. A method for manufacturing a wiring substrate including a through electrode, the method comprising:
providing a device substrate having a through hole, an opening of the through hole being blocked by a current supply path and the wiring substrate including the device substrate as a core layer with the through electrode, wherein the device substrate includes an insulator material;
disposing a first metal in the through hole to form the through electrode by electroplating, in a depth direction of the through hole, using the current supply path;
planarizing a first surface of the device substrate by blocking the opening of the through hole formed in the device substrate; and
forming a seed layer as the current supply path on the planarized surface of the device substrate, wherein the first surface of the device substrate is planarized by blocking the opening of the through hole formed in the device substrate using a temporary filling agent.

9. The method according to claim 8, wherein the first surface of the device substrate is planarized by adhering a first protective sheet onto the first surface of the device substrate, wherein the opening of the through hole is blocked using the temporary filling agent, and wherein the seed layer as the current supply path is formed on the planarized surface of the device substrate after the first protective sheet is removed.

10. The method according to claim 9, wherein a portion of a second protective sheet is adhered to the seed layer.

11. The method according to claim 8, wherein the first surface of the device substrate is planarized by adhering sheet-shaped material to the first surface of the device substrate, and a portion of the adhered sheet-shaped material is removed.

12. A method for manufacturing a wiring substrate including a through electrode, the method comprising:
providing a device substrate having a through hole, an opening of the through hole being blocked by a current supply path and the wiring substrate including the device substrate as a core layer with the through electrode, wherein the device substrate includes an insulator material;
disposing a first metal in the through hole to form the through electrode by electroplating, in a depth direction of the through hole, using the current supply path; and
adhering the device substrate to a noble metal surface of an electrode substrate, wherein the noble metal surface is the current supply path, wherein a base material of the electrode substrate includes a flexible material, and wherein the noble metal surface includes at least one of Au, Pt, and Ti.

13. A method for manufacturing a wiring substrate including a through electrode, the method comprising:
providing a device substrate having a through hole, an opening of the through hole being blocked by a current supply path and the wiring substrate including the device substrate as a core layer with the through electrode, wherein the device substrate includes an insulator material;
disposing a first metal in the through hole to form the through electrode by electroplating, in a depth direction of the through hole, using the current supply path; and
adhering the device substrate to a noble metal surface of an electrode substrate, wherein the noble metal surface is the current supply path, wherein a surface roughness Rmax of the noble metal surface is 1 µm or more.

* * * * *